(12) United States Patent
Jensen

(10) Patent No.: US 6,566,994 B1
(45) Date of Patent: *May 20, 2003

(54) COIL FOR AN AC CURRENT SENSOR

(75) Inventor: Charles R. Jensen, Camano Island, WA (US)

(73) Assignee: Fluke Corporation, Everett, WA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1065 days.

(21) Appl. No.: 08/819,527

(22) Filed: Mar. 17, 1997

(51) Int. Cl.$^7$ ............................................. H01F 27/28
(52) U.S. Cl. ..................... 336/189; 336/174; 336/176; 336/190
(58) Field of Search ................................ 336/189, 190, 336/191, 174, 176, 221, 222

(56) References Cited

U.S. PATENT DOCUMENTS

| | | | | |
|---|---|---|---|---|
| 873,780 A | * | 12/1907 | Peterson | 336/190 |
| 1,342,209 A | * | 6/1920 | Giblin | 336/190 |
| 2,282,386 A | * | 5/1942 | Sinninger | 336/189 |
| 2,763,805 A | * | 9/1956 | Bendell | 336/189 |
| 3,378,761 A | * | 4/1968 | Morgan | 336/174 |
| 3,449,703 A | * | 6/1969 | Steen | 336/174 |
| 3,489,974 A | * | 1/1970 | Montross | 336/176 |
| 5,057,769 A | | 10/1991 | Edwards | 324/127 |
| 5,583,475 A | | 12/1996 | Raholijaona et al. | 336/229 |

* cited by examiner

Primary Examiner—Anh Mai
(74) Attorney, Agent, or Firm—George T. Noe

(57) ABSTRACT

An improved formable coil for an AC sensor having a predetermined length and a predetermined number of turns. The coil is wound in multiple passes in opposite directions, with a predetermined number of passes in each direction to fill in any gaps and provide a stable helical-wound coil. A preferred embodiment is wound on a collapsible mandrel to facilitate free removal of the coil from the mandrel.

3 Claims, 2 Drawing Sheets

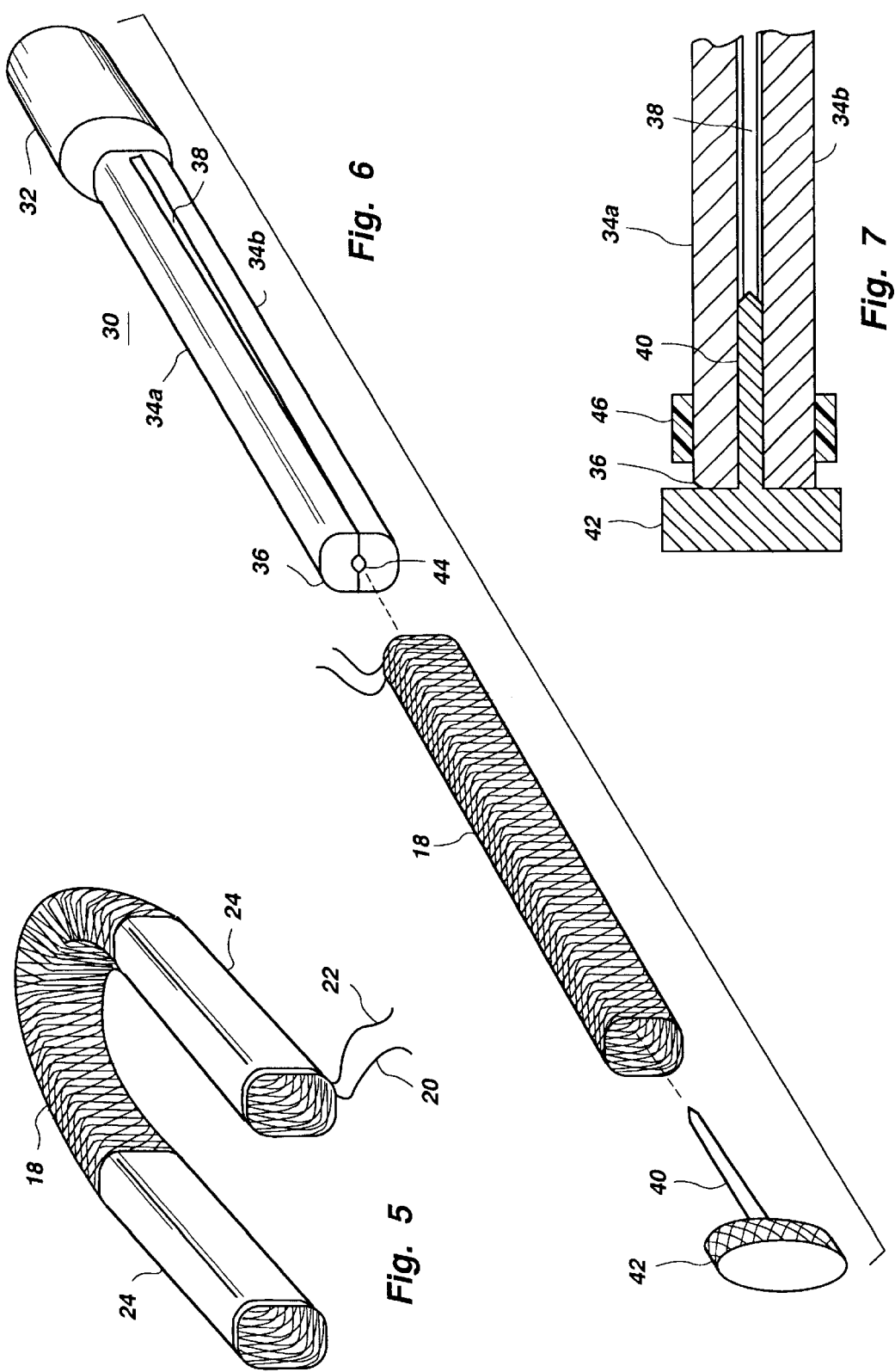

COIL FOR AN AC CURRENT SENSOR

BACKGROUND OF THE INVENTION

This invention relates generally to AC current sensors, and in particular to an improved formable coil for an AC current sensor.

U.S. Pat. No. 5,057,769 discloses an AC current sensor for detecting and measuring alternating current (AC) in a conductor without cutting or breaking the conductor. The AC current sensor comprises a U-shaped main coil which defines a measuring recess in which the sensed AC current-carrying conductor is located when a measurement is taken. According to the prior art, it is preferred that the main coil be a long solenoidal coil which is wound with a single layer of windings of wire, and which has an air core. It is also preferred that the main coil be wound so that the mean turn area of wire and the number of turns of wire per unit length are uniform along the entire the length of the main coil in order to reduce sensor errors, and thereby increase measurement accuracy, and to reject the effects of outside current fields.

There are several drawbacks in providing a current sensor in which the main coil is a long solenoidal coil which is wound with a single layer of wire. Refer to the example shown in FIG. 1 of the drawings, wherein a coil having a length L is wound in a single layer of insulated wire with each turn placed against a preceding turn. Any variances in wire diameter or thickness in the insulated coating, or gaps in adjacent turns, result in non-uniformity of the number of turns per unit length, causing sensor errors. Also, when the coil is bent into a U shape in forming the sensor, it is difficult to maintain the uniformity of both the wire's mean turn area and the number of turns of wire per unit length. If the bends are sharp, there will be a tendency for turns of wire to pop out of place at the bend. If there are kinks in the bend, or if the radius of the bend is not smooth, sensor errors will result. Further, once the single-layer main coil is formed into its final desired shape and placed into position in the sensor, both the shape and position must be maintained in order to prevent sensor errors. Another problem associated with single-layer coils is that the turns will not lay exactly as placed due to the tensile strength of the wire, resulting a in slight unwinding over the length of the coil after it is completed. On a coil wound on a cylindrical mandrel, this is noticeable as a slight expansion in the finished coil diameter; however, on a coil wound on a rectangular or flat mandrel, a definite skew or twist is exhibited over the length of the coil. In the production of current sensors, the forming and positioning of the main coil must be repeatable so that any desired number of current sensors may be manufactured quickly and simply.

In the prior art, an attempt to solve some of these problems involved winding the main coil on a length of straight, flexible plastic tubing prior to bending the main coil into the desired shape. Since the precise length of the main coil is relatively unimportant, it was made as long as possible and the diameter of wire turns made relatively small in order to maintain smooth bend radii and uniformity of mean turn area and number of turns per unit length. The trade-off with this arrangement is that measurement sensitivity is reduced. One coil disclosed in U.S. Pat. No. 5,057,769 was 30 AWG double insulated magnet wire wound in a single layer on a quarter-inch diameter form 16.5 inches long at a rate of 90 turns per inch.

In order to reduce the coil length to under four inches for a hand-held measuring instrument, and to increase measurement sensitivity and accuracy as well as to improve manufacturability of the current sensor, it was desired to provide a main coil of smaller dimensions that could be formed into a desired shape without the constraints of the prior art. The approach taken to solve this problem was to use a finer-gauge wire (smaller diameter) wound in multiple layers to provide the desired number of turns.

An attempt to increase the number of turns to improve sensitivity by winding a second layer over the first layer resulted in several manufacturing problems. The number of turns was difficult to control, and often the turns of the second wrap would fall into gaps created between adjacent turns of the first layer. Moreover, even when a second wrap could be attained, forming the coil into a U shape resulted in an unstable skewing of the coil turns around the arc of the bend. Even with some sort of stiffener, such as plastic tape or a strip of plastic, adhered to the inner side of the coil along its length, problems in producing a stable, formable coil persisted.

SUMMARY OF THE INVENTION

In accordance with the present invention, a stable, formable coil exhibiting a high degree of accuracy and high rejection of unwanted or extraneous fields has been attained by winding the turns of the coil in opposite directions in multiple passes, with a selected number of passes in each direction to fill in any gaps and provide a total desired overall number turns. From the coil length and number of turns required, the pitch of the wind, the number of turns per pass, the number of passes required, and the wire gauge can be determined to provide a stable helical-wound coil. A preferred embodiment is wound on a collapsible mandrel to facilitate free removal of the coil from the mandrel. With an equal number of passes in each direction, errors are canceled.

It is therefore one object of the present invention to provide an improved coil for an AC current sensor.

It is another object to provide a sensor coil with improved performance characteristics that is easily formed into a desired shape.

It is a further object to provide an improved coil that is easily fabricated.

It is yet a further object to provide a repeatable manufacturing process for sensor coils using a collapsible winding mandrel.

Other objects, features, and advantages of the present invention will become obvious to those having ordinary skill in the art upon a reading of the following description when taken in conjunction with the accompanying drawings.

BRIEF DESCRIPTION OF THE DRAWINGS

FIG. 5 shows a completed sensor coil formed into its intended operating configuration;

FIG. 6 shows an exploded perspective view of a mandrel assembly with a completed coil; and FIG. 7 shows a cross-sectional view of one end of a mandrel assembly for fabricating a sensor coil in accordance with the present invention.

DETAILED DESCRIPTION OF THE INVENTION

Figure 1:
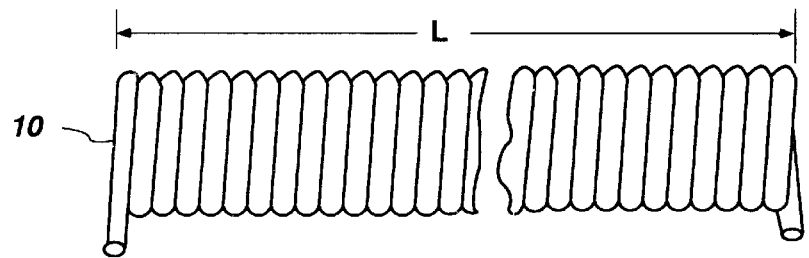
FIG. 1 shows a prior art main coil for a current sensor.
Figure 2:
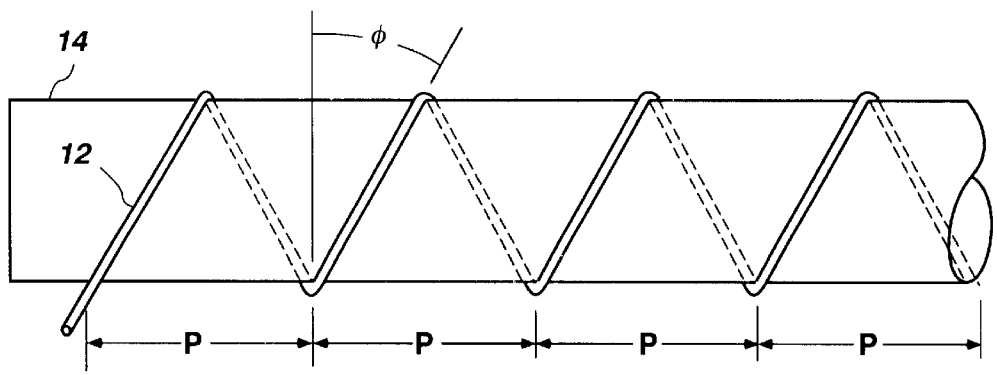
FIG. 2 shows a partial coil with a wire wound in one direction in accordance with present invention.

Referring to FIG. 2 of the drawings, a wire 12 is shown wound in one direction on a mandrel 14 at a constant pitch P so that a stable, multiple-layer helical-wound coil may be produced. For such a coil, a relationship exists among the various factors of the overall length L of the coil, the circumference of the mandrel, the pitch P of the turns of wire, the number of turns T, the number of layers (or passes, wherein winding in one direction is defined as a pass), and the wire gauge. It has been determined empirically that an angle of $\phi=7$ degrees provides a mechanically stable coil. Keeping in mind that $P=2 \sin \phi$, this translates to roughly $P=0.25D$, where D is the diameter of the mandrel.

As an example, suppose it is desired to have a coil four inches long and a half-inch internal diameter, with 2000 turns to provide a desired sensitivity to a field produced by current passing through a wire. If we let P=0.125 inch, the number of turns per pass in four inches is 32. But 2000 divided by 32 is equal 62.5 passes. If the number of passes is adjusted to 62, an even integer, the number of turns required for a four-inch long coil is 32.25, resulting in a pitch of 0.124 inch rather than 0.125 inch, but well within reason. To provide a 100% fill of wire in each direction so that there are no gaps, 0.124 inch is divided by 31 to obtain the maximum wire diameter of 0.004 inch. Looking on an American Wire Gauge chart, it can be seen that 38 AWG is nominally 0.003965 inch at room temperature, making it the selection. This exercise is simply to illustrate the interrelation of factors so that a coil of any desired dimensions can readily be determined.

Figure 3:
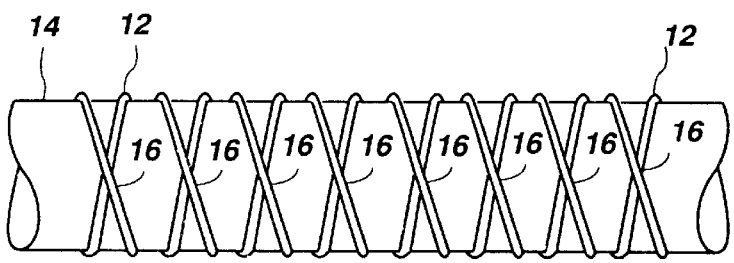
FIG. 3 shows a partial coil with a wire wound in both directions in accordance with present invention.

FIG. 3 shows a partial coil in accordance with the present invention wherein wire 12 is wound from left to right on a first pass, and then from right to left on a second pass. Illustrative here is that the wire lays against the mandrel on everywhere except at crossover points 16. It should be noted that the crossover point is at different location on each pass so that an even thickness can be held. Thus, while referred to as a multiple-layer coil, multiple-layer does not mean stacking of wires in layers in which each pass results in a layer.

Figure 4:
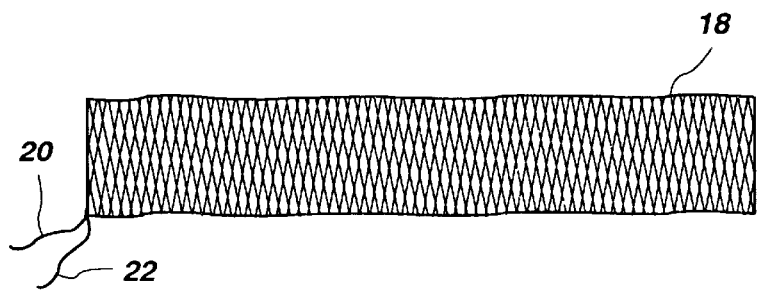
FIG. 4 shows a plan view of a completed sensor coil in accordance with the present invention.

FIG. 4 shows a plan view of a completed coil 18 in accordance with a preferred embodiment of the present invention with all the spaces or gaps filled in. The coil is wound in an even number of passes so that both ends 20 and 22 of the wire are available at the same end of the coil. This is so that when formed into its final configuration, electrical connections to the coil may be easily made. Also, with an even number of passes, any errors created in one direction in the winding process will be canceled by equal and opposite errors created in the opposite direction.

FIG. 5 shows a completed sensor coil 18 formed into its intended operating configuration. Optional plastic sleeves 24 may be used if desired to aid in retaining the final form. Sleeves 24 may be fabricated simply by wrapping plastic tape around the legs of the coil while the coil is still on the mandrel. It has been found, however, that a coil fabricated in the manner described herein may easily be formed into any desired shape without distorting the uniformity of mean turn area or number of turns per unit length. There is no requirement that the wound coil be cylindrical or round, although it could be. Thus, the mandrel on which the coil is wound determines the shape, and it could be round, rectangular, or even flat. The criteria is that whatever the mandrel shape is, the cross-sectional area along the length of the mandrel should be maintained constant so that the mean turn area along the length of the final coil will be constant.

FIG. 6 shows an exploded perspective view of a collapsible mandrel assembly shown in its collapsed configuration with a completed coil. A mandrel 30 has a proximal end 32 designed to fit into the chuck of a winding machine, a barrel 34a, 34b onto which a coil is wound, and a distal end 36. The barrel 34a, 34b has a lengthwise slot 38, which is tapered to bring the two ends of barrel halves 34a, 34b together at distal end 36. Thus, in the collapsed configuration, the coil-winding barrel portion of mandrel 30 is tapered.

A pin 40 having a knurled knob 42 is inserted into a groove 44 in the distal end 36 to spread the ends of barrel 34a, 34b to establish the coil-winding configuration. This can be better understood by reference to FIG. 7, which shows a cross-sectional view of the distal end of mandrel assembly 30 for fabricating a sensor coil in accordance with the present invention. With pin 40 inserted into the end 36, the barrel halves 34a and 34b are parallel with each other so that the cross-sectional area of the barrel 34A, 34b is uniform over the entire length of the barrel. As mentioned earlier, the barrel 34a, 34b does not have to be cylindrical, and can be any desired shape, depending upon the requirements of the coil to be fabricated. To assist in establishing the length of the coil to be wound, a stop 46 formed from a resilient material such as rubber or plastic may be used. Two such stops 46 may be slipped over the mandrel, one for each end of the coil during the winding process. These stops should be sufficiently thick to prevent the wire from winding up onto the stop. To remove a completed coil, pin 40 is removed from the end 36, and stop 46 is slipped off the mandrel. Then the coil may be slipped off the mandrel. An alternative to using stops 46 in establishing the ends of the coil is to slightly texture the coil-end portions of the mandrel so that the wire can grip the mandrel in the coil-end locations. The texturing may be accomplished by lightly filing or roughing up the mandrel surface with emery paper.

Using the foregoing techniques, several sensor coils have been fabricated and tested. An unsuspected advantage discovered during testing is that the rejection of extraneous fields from outside to inside is on the order of 40:1. In other words, when the current is being measured in a particular wire placed inside the horseshoe form of the coil, any fields outside the horseshoe have only a 2.5% effect on the field being measured.

While a product containing a coil fabricated in accordance with the present invention has not yet been introduced into the market place, one coil fabricated and tested and meeting the foregoing desired specifications and results is 3.68 inches in overall length on a mandrel having a 0.480×0.110 cross-sectional area, and was wound using 38 AWG magnet wire with a pitch of 0.1584 inch in 84 passes, with 23.23 turns per pass, and a total of 1956 turns. Other coils which also perform well have been fabricated using other dimensions and criteria, such as fewer total turns, in as little as 20 or 40 passes.

While I have shown and described the preferred embodiment of my invention, it will be apparent to those skilled in the art that many changes and modifications may be made without departing from my invention in its broader aspects. It is therefore contemplated that the appended claims will cover all such changes and modifications as fall within the true scope of the invention.

What I claim as my invention is:

1. An AC current sensor having a coil structure for sensing current in a conductor, said coil structure comprising:

a wire wound in a predetermined number of turns, with a uniform mean turn area of wire for each turn, at a constant pitch over a predetermined length along a longitudinal axis in passes in opposite directions along said longitudinal axis to provide an elongate coil structure wherein a number of turns in each pass is defined by said predetermined length divided by said constant pitch, a number of passes in each direction is defined by said predetermined number of turns divided by said number of turns in each pass, and a diameter of said wire is defined by said constant pitch divided by said number of passes in one direction, so that gaps between adjacent turns of wire in any pass are substantially completely filled in with turns of wire in other passes, wherein said coil structure is flexible along said length while maintaining substantially constant uniformity of mean turn area and number of turns per unit length.

2. An AC current sensor in accordance with claim 1 wherein the number of passes in said opposite directions are equal.

3. An AC current sensor in accordance with claim 1 wherein said coil structure has an air core.

* * * * *